(12) United States Patent
Chen et al.

(10) Patent No.: US 6,288,540 B1
(45) Date of Patent: Sep. 11, 2001

(54) OPTIMIZED ORTHOGONAL GRADIENT TECHNIQUE FOR FAST QUANTITATIVE DIFFUSION MRI ON A CLINICAL SCANNER

(75) Inventors: Zhong Chen, Rochester; Jianhui Zhong, Pittsford; Wingchi Edmund Kwok, Rochester, all of NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 09/573,940

(22) Filed: May 19, 2000

Related U.S. Application Data
(60) Provisional application No. 60/135,214, filed on May 21, 1999.

(51) Int. Cl.$^7$ .................................................. G01V 3/00
(52) U.S. Cl. ............................................. 324/300; 324/306
(58) Field of Search .................................. 324/300, 306, 324/307, 309, 312, 314, 318

(56) References Cited

U.S. PATENT DOCUMENTS

| | | | |
|---|---|---|---|
| 5,049,820 | * 9/1991 | Briand et al. ........................ | 324/309 |
| 5,539,310 | * 7/1996 | Basser et al. ........................ | 324/307 |
| 5,786,692 | * 7/1998 | Maier et al. ........................ | 324/307 |
| 5,969,524 | * 10/1999 | Pierpaoli et al. ..................... | 324/307 |

OTHER PUBLICATIONS

Chun et al., "Single–Shot Diffusion–Weighted Trace Imaging on a Clinical Scanner", Magn. Reson. Med. 40:622–628 (1998).

Mori et al., "Diffusion Weighting by the Trace of the Diffusion Tensor within a Single Scan", Magn. Reson. Med. 33:41–52 (1995).

Basser et al., "A Simplified Method to Measure the Diffusion Tensor from Seven MR Images", Magn. Reson. Med. 39:928–934 (1998).

Conturo et al., "Encoding of Anisotropic Diffusion with Tetrahedral Gradients: A General Mathematical Diffusion Formalism and Experimental Results", Magn. Reson. Med. 35:399–412 (1996).

Schick, "Simultaneous Highly Selective MR Water and Fat Imaging Using a Simple New Type of Spectral–Spatial Excitation", Magn. Reson. Med. 40:194–202 (1998).

* cited by examiner

Primary Examiner—Louis Arana
(74) Attorney, Agent, or Firm—Blank Rome Comisky & McCauley LLP

(57) ABSTRACT

A technique for MRI or the like employs optimized orthogonal gradients. For a device having a peak physical magnetic field gradient strength $G_0$, the gradients are optimized if, in physical space, one gradient has a value $-0.5G_0$ while the two gradients orthogonal thereto have the value $G_0$. That is equivalent to an optimized orthogonal gradient space in which one gradient has a value $1.5G_0$ while the two gradients orthogonal thereto have the value zero. The gradients are cycled over a sequence of six gradient pulses to provide enough data to calculate the diffusion tensor.

14 Claims, 3 Drawing Sheets

OPTIMIZED ORTHOGONAL GRADIENT TECHNIQUE FOR FAST QUANTITATIVE DIFFUSION MRI ON A CLINICAL SCANNER

REFERENCE TO RELATED APPLICATION

This application claims the benefit of U.S. Provisional Application No. 60/135,214, filed May 21, 1999, whose disclosure is hereby incorporated by reference in its entirety into the present disclosure.

BACKGROUND OF THE INVENTION

The present invention is directed to a system of and method for imaging an object using a magnetic field and more particularly to a system of and method for generating a magnetic field with optimized orthogonal gradients for imaging the object. The invention is particularly, but not exclusively, intended for use with Magnetic Resonance Imaging (MRI).

Diffusion-weighted MRI is presently the only available noninvasive method which provides information depicting molecular displacements comparable to cell dimensions. It can provide physiological information unattainable by other conventional imaging modalities. Diffusion-weighted imaging based on water molecular diffusion can rapidly identify and quantify ischemic changes within several minutes following the onset of ischemia. Numerous efforts have been made to produce diffusion-weighted images for clinical use, particularly for the detection of brain ischemia. Because the diffusion tensor trace is invariant upon rotation of the coordinate system and is independent of the tissue's local fiber-tract direction, the diffusion-weighted trace image is an isotropically weighted MRI image in which the intensity is relative to the trace of the diffusion tensor.

Determination of the diffusion trace usually requires separate measurements of the diffusion constants in the three orthogonal gradient directions. More rigorously, the trace can be determined from a full diffusion tensor which requires more than three measurements.

A diffusion tensor which provides information to characterize molecular displacements in three dimensions can be used to interpret anisotropic tissue, such as brain white matter, both in structure and function. The diffusion tensor is therefore introduced as an additional MRI contrast parameter. That is usually accomplished by combining data from several separate measurements with diffusion weighting in different directions. Sensitivity to diffusion effects is proportional to the square of the magnetic field gradient strength. Most clinical whole-body scanners have gradients of only 10–30 mT/m. As a consequence, longer gradient pulses are required, which may prolong the echo time (TE) and result in major signal losses and motion artifact exacerbation.

The diffusion-weighting factor b is a user-controlled parameter which defines the extent of the diffusion weighting. The efficiency of a pulse sequence for diffusion weighting is proportional to the diffusion-weighting factor with the same TE. Clearly, with greater magnetic field gradient strength, a shorter TE will provide for the same diffusion weighting and result in higher SNR diffusion-weighted images. However, the ability to increase the gradient is highly constrained. MRI techniques for the measurements of the diffusion tensor proposed so far are highly susceptible to background noise contamination, and their usefulness has therefore been limited.

To improve the accuracy in determining the diffusion tensor acquired with the fewest diffusion-weighted images, a number of gradient schemes have been employed recently. One such scheme includes some invariant measures of diffusion tensor. Another employs the tensor dot product of the anisotropic part of the diffusion tensor with itself, D:D, as a scale measure of the magnitude of diffusion anisotropy in a voxel, and then obtains information about the pattern of diffusion tensors in an image using tensor algebraic approaches. Unfortunately, most of these anisotropy measurements are time-consuming. For that method to be clinically practicable, one must reduce the time required to retain adequate estimates.

Still another scheme is a tetrahedral sampling scheme to analyze diffusion tensors of samples with axially symmetrical diffusion, but that scheme does not satisfy general anistropical diffusion samples. Yet another applies six diffusion gradient vectors of equal magnitude with uniform oriented distribution in a cuboctahedron scheme for general diffusion samples. However, the latter two schemes use triclinic combining gradients.

To reduce experiment time and simplify post-processing procedures, several gradient pulse sequences with single-shot scans to produce isotropic diffusion-weighted images have been proposed recently. One such sequence uses an orthogonality relationship as one basic condition and reports a number of gradient waveforms for diffusion trace weighting optimized from two-step numerical methods. Another uses an orthogonality relationship to design an original gradient waveform for single-shot isotropic diffusion weighting. Still another designs different single-shot diffusion trace weighted MR gradient waveforms applying a set of combining gradients with peak amplitudes of $\sqrt{3}G_0$, where $G_0$ is the peak amplitude of a single physical gradient. A fourth implements their single-shot trace-weighted acquisition scheme for isotropic diffusion echo-planar imaging on a clinical scanner.

SUMMARY OF THE INVENTION

It will be readily apparent from the foregoing that a need exists in the art for a more efficient, accurate, and practical technique for MRI. Therefore, it is a primary object of the present invention to improve the efficiency of techniques such as diffusion-weighted trace MRI.

It is another object of the present invention to provide a more accurate determination of the eigenvalues and eigenvectors of the effective diffusion tensor by optimization of the gradient pulse design.

To achieve the above and other objects, the present invention is directed to a system of and method for MRI or other magnetic imaging in which an analytical expression for optimized orthogonal gradients is derived from a combination of the x, y, and z orthogonal gradients. Two gradient pulse sequences based on optimized orthogonal gradients are designed for single-shot diffusion-weighted trace and diffusion tensor MRI, respectively. The effects of background gradients and cross-terms between diffusion and imaging gradients are minimized by keeping the symmetry of the gradient pulses in the sequences. The picture representation of a local fiber-tract axis is visualized by the largest eigenvector of the diffusion tensor.

Experiments have been performed on a clinical 1.5T GE SIGNA MRI scanner with peak gradient strength of 23 mT/m. A standard GE quadrature birdcage head coil was used to image in-vivo human brains and also a chicken gizzard phantom. To obtain pure diffusion tensor and trace images, a custom program written in MATLAB was used to calculate and process original data. The maximum amplitude and diffusion weighting factor of a single optimal gradient were 1.5 and 2.25 times those of a single physical gradient respectively without modifying hardware. Compared to conventional methods, the images with the same diffusion weighting were obtained with a shorter TE and a higher SNR using the gradient pulse sequences of the present invention. The diffusion-weighted trace images using the single-shot sequence showed a relatively uniform diffusion throughout the white matters, which is in agreement with those calculated from three orthogonal diffusion measurements. The effective diffusion tensor was obtained more accurately and efficiently. Experimental results demonstrated that some structure features such as diffusion anisotropy, structural similarity, local fiber-tract axis and tissue organization were characterized by the diffusion tensor.

The present invention provides a new technique to obtain higher efficiency and accuracy for diffusion MRI. The technique is particularly useful for the diffusion tensor measurement and trace mapping of human brains on conventional MR scanners, especially those equipped with lower peak gradient such as 10 mT/m.

An important effect of the invention is to develop gradient pulse sequences which can improve accuracy in determining the eigenvalues and eigenvectors of the effective diffusion tensor and to increase the efficiency for single-shot isotropic diffusion-weighted MRI. Though combinations of the three physical gradients have previously been discussed and related gradient schemes for diffusion weighting have also been proposed, this is the first time that optimized orthogonal gradients resulting from analytical calculations were proposed as a more efficient, accurate, and practical method.

Optimized orthogonal gradients are designed as follows. Three combining gradients satisfy orthogonal properties, and their peak amplitudes are equal and maximum. An analytical solution of optimized orthogonal gradients is derived from the combinations of the three physical orthogonal gradients. Four sets of optimized orthogonal gradients are derived from geometrical symmetry. Their peak amplitudes are $1.5G_0$.

An effective treatment of the diffusion tensor based on optimized orthogonal gradients is provided. That treatment provides a maximum and equal diffusion-weighting factor for generally anisotropic tissues in six noncolinear directions. The six higher SNR diffusion-weighted images permit more accurate determination of the six elements of the diffusion tensor. The diffusion weighting factor of the gradient pulse sequence proposed herein is 1.33 times that of a recent report applying a gradient pulse sequence with peak amplitude of $\sqrt{3}G_0$ for single-shot isotropic diffusion-weighted imaging. The gradient pulse sequences are designed with higher symmetry to minimize the background gradient effects and cross-terms between diffusion and/or imaging gradients.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

Figure 1:
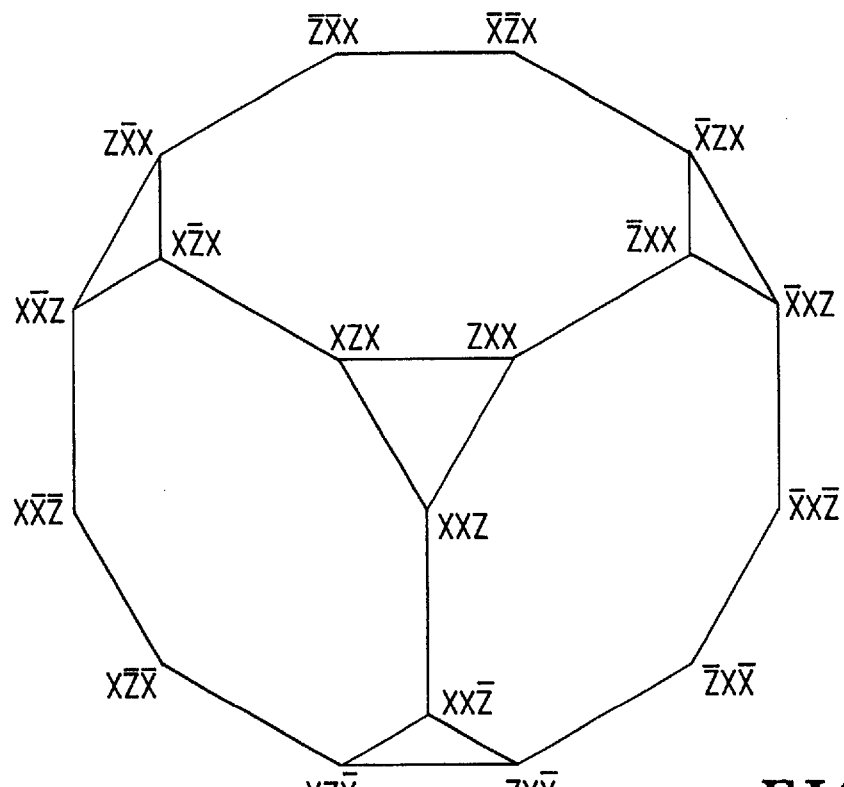
FIG. 1 is a diagram showing a geometrical symmetry used in the preferred embodiment.

A preferred embodiment of the present invention will now be set forth in detail with reference to the drawings, in which like reference numerals refer to like components throughout. The present disclosure will first describe how to design a set of optimized orthogonal gradients with a combination of the three physical orthogonal gradients from a vector model, and then extend them to a general case from geometric symmetry.

According to non-equilibrium thermodynamics theory, translational diffusion tensor is a second-rank symmetric tensor with six independent elements. An important property of the eigenvectors corresponding to different (nondegenerate) eigenvalues of a symmetric second-rank tensor is that they are orthogonal. Separate application of orthogonal x, y, and z diffusion gradients can provide independent measurement of $D_{xx}$, $D_{yy}$ and $D_{zz}$ which can directly determine the trace of the diffuision tensor, but that would involve less accurate measurements using weaker gradient strengths. With respect to a more straightforward approach, one might expect to look for the maximum diffusion-weighting factor while the combining gradients retain orthogonal properties. The optimized orthogonal gradients are designed to match the following is requirements: the three combining gradients satisfy orthogonal properties, and their peak amplitudes are equal and maximum. Under the guidance of physical intuition, it is possible to find a set of optimized orthogonal gradients.

The set of optimized orthogonal gradients can be obtained under the following circumstances. Assume an optimized orthogonal frame u, v, w and assume further that $G_u$, $G_v$, and $G_w$ which are orthogonal to each other are the optimized gradient strengths along the u, v, and w axes, respectively. One can express a gradient vector in the optimized orthogonal frame as a linear combination of the $G_x$, $G_y$, and $G_z$ gradients, all of which have the same peak gradient strength $G_0$ since they obey the law of vector addition and the symmetric requirement:

$$G_u = xG_x + yG_y + zG_z$$
$$G_v = yG_x + zG_y + xG_z$$
$$G_w = zG_x + xG_y + yG_z, \tag{1}$$

where x, y and z are proportional coefficients to be determined. Since the absolute values of x, y, and z are equal to or smaller than 1, 1 is chosen for x without loss of generality. The optimum y and z values are now determined. Some general mathematical expressions are obtained from the simple geometric relations:

$$|G_{u\,max}| = |G_{v\,max}| = \sqrt{x^2 + y^2 + z^2}G_0 = \sqrt{1 + y^2 + z^2}G_0. \tag{2}$$

The orthogonality constraint imposes the following relation:

$$|G_{u\,max} + G_{v\,max}| = \sqrt{(1+y)^2 + (y+z)^2 + (z+1)^2}G_0 = \sqrt{2}G_{u\,max}. \tag{3}$$

Substituting Eq. (2) into Eq. (3) gives:

$$y + z + yz = 0. \tag{4}$$

If y=0, then z=0. That is the trivial case of an x, y, and z orthogonal frame. Since |y| and |z| both $\leq 1$ and y$\neq$0, y and z must have opposite signs. Assuming y is positive, Equation (4) can be solved to obtain:

$$z = -\frac{y}{1+y}. \quad (5)$$

Substituting Eq. (5) into Eq. (2), results in the following:

$$G_{u\max} = G_{v\max} = G_{w\max} = \sqrt{1 + \left(1 - \frac{1}{1+y}\right)^2 + y^2}\, G_o. \quad (6)$$

Equation (6) is a monotonically increasing function, i.e., $G_{u\,max}$ increases with increasing y. Since $|y| \leq 1$, $G_{u\,max}$ reaches its maximum 1.5 $G_0$ when y=1, where z=−0.5. It is clear that three optimized orthogonal gradients can be designed with combinations of x, y, and z gradients in permutations of (1, 1, −0.5) of the peak physical gradient strength $G_0$. Without modifying hardware, the peak amplitude and corresponding diffusion-weighted factor of a single optimized gradient are 1.5 and 2.25 times those of a single physical gradient, respectively. Compared to conventional methods, the images with the same diffusion weighting are obtained with shorter TE and higher SNR. That also makes it possible to perform diffusion-weighting experiments in clinical scanners with lower peak diffusion gradients without modifying hardware.

Although the analytical solution of optimized orthogonal gradients has been derived from the choice of directions and magnitudes of the three physical orthogonal gradients, it is not enough to determine a diffusion tensor, because a diffusion tensor usually has six independent elements. To simplify the calculation of the diffusion tensor, it is desirable to determine the six elements from the measurement of diffusion-weighted MRI in six different directions. Therefore, at least six ratio images (i.e., $\log(A(\underline{b})/A(\underline{b}=0))$) are required to solve for each element.

From the viewpoint of geometrical symmetries in three-dimensional space, it is possible to find other sets of optimized orthogonal gradients which have equal magnitude with uniformly oriented distribution. A few will be briefly described to show explicitly how they are functionally related to the optimized orthogonal gradients mentioned above.

Suppose that there is a point whose coordinates are x, y, and z. If that point is part of a structure having threefold rotational symmetry, then there must be two other points whose coordinates are cyclic permutations of x, y, and z and which are related to the point (xyz) by threefold rotational symmetry. The three points form the vertices of an equilateral triangle whose coordinates are respectively: xyz, yzx, and zxy. Cubic symmetry implies mirrors disposed diagonally through the Cartesian axes and reflection of the six points in each of the coordinate planes.

If the initial point on which the cubic symmetry elements act to generate the entire point complex is termed the "generating point", the coordinates of the generating point of the optimized orthogonal gradients are xxz, where z=x/2=0.5. A representation of the possible gradient orientations on a truncated cube is shown in FIG. 1, and their geometrical features in comparison with other previously proposed schemes are listed in Table 1 below. Comparisons of the preferred embodiment with other gradient schemes in their diffusion-weighting are listed in Table 2 below. The geometrical symmetry shown in FIG. 1 shows that there are twelve orientations of which four sets of optimized orthogonal gradients are composed. The last line of each table corresponds to the present invention.

TABLE 1

Comparison of different geometrical features

| Coordinates of Generating point | Special condition | Vertices number | Polyhedron generated |
|---|---|---|---|
| xxx | x = y = z = 1 | 8 | Cube |
| xx0 | x = y = 1, z = 0 | 12 | Cubocatahedron |
| xxz | x = y = 2z = 1 | 24 | Truncated cube |

TABLE 2

Comparison of different gradient schemes and their diffusion-related features

| Gradient amplitude | Gradient direction | Diffusion Weighting factor (in unit $b_0$) | Symmetry type |
|---|---|---|---|
| $\sqrt{3}G_0$ | Triclinic | $3.0b_0$ | Axial |
| $\sqrt{2}G_0$ | Triclinic | $2.0b_0$ | General |
| $1.5\,G_0$ | Orthogonal | $2.25b_0$ | General |

The truncated cube of FIG. 1 has triangular and octagonal faces. Cubic symmetry moreover implies that the number of vertices is 24. When the gradient directions are sampled uniformly, a set of diffusion weighted MRIs is produced. Setting x=y=z=1 will produce the eight vertices of a cubic symmetry. Setting x=y=1, and z=0 will produce the twelve vertices of a cube with cuboctahedron symmetry. Clearly, the amplitude of the diffusion gradients is uniform in each of three schemes, and their directions are arranged in an isotropically oriented (uniformly distributed) manner.

It is noted that the gradient scheme according to the preferred embodiment uses a reduced orthogonal frame, while the other two gradient schemes use a triclinic frame. Clearly, the scheme according to the preferred embodiment is preferable to determine a diffusion tensor with enough independent conditions. Therefore, the analytical expressions can be obtained for the three principal diffusivities of a defusion tensor $\underline{D}$ by solving the characteristic equation of $\underline{D}$. The eigenvectors of $\underline{D}$ generally can also be solved analytically or numerically once the eigenvalues are determined. Those expressions are quite general, since they do not require the specific functional form of the gradient pulse sequence used to produce it, but only the knowledge of the geometrical symmetry.

It is clearly preferable to determine $\underline{D}$ directly from a set of seven diffusion-weighted images. It is known in the art that as a general matter, the six diffusion weighted images from six noncolinear directions and an additional baseline image (without diffusion gradient) permit the determination of all the six elements of the diffusion tensor. However, the present invention involves the realization that there is an exception even if no three directions of the combining gradient vectors are in the same plane and no two directions of the combining gradient vectors are collinear. The six diffusion-weighted images from two sets of orthogonal gradients cannot provide enough independent information to calculate a diffusion tensor. A diffusion trace can be obtained from three independent measurements in three orthogonal gradient directions and is invariant upon rotation of a coordinate system. Because the rotationally invariant measure of the diffusion trace is a constrained condition, there are only five independent parameters from any six diffusion-weighted images in two sets of noncolinear orthogonal gradients. Now it will be shown how to determinate the diffusion tensor $\underline{D}$ optimally from six diffusion-weighted images and one baseline image.

When a single bipolar gradient pulse has a given total time τ between the onset and ending points of the gradient pulses and the peak gradient strength $G_0$, its diffusion weighting factor is $b_0 = \gamma^2 G_0^2 \tau^3/12$. Here γ is the gyromagnetic ratio. The echo signal attenuation satisfies the following relationship in diffusion tensor MRI:

$$\ln\left(\frac{A(\underline{b})}{A(\underline{b}=\underline{0})}\right) = -\int_0^\tau k(t') \cdot \underline{D} \cdot k(t') \, dt' = -\sum_{i=1}^{3} \sum_{j=1}^{3} b_{ij} D_{ij}. \quad (7)$$

$\underline{D}$ is a diffusion tensor;

$$k(t') = \int_0^{t'} \gamma G(t'') \, dt''$$

is the k-space trajectory; $D_{xx}$, $D_{yy}$, and $D_{zz}$ are the three diagonal elements of the diffusion tensor; $D_{ij}=D_{ji}$ (i≠j) are the cross-terms or off-diagonal elements of the diffusion tensor; $A(\underline{b})$ is the echo intensity for a gradient sequence $\underline{b}$; and $A(\underline{b}=\underline{0})$ is the echo intensity without gradient. The component of the i th row and j th column of the symmetric matrix, $\underline{b}$, is expressed as following:

$$b_{ij} = \gamma^2 \int_0^\tau \left[\int_0^{t'} G_i(t'') \, dt''\right] \cdot \left[\int_0^{t'} G_j(t'') \, dt''\right] dt'. \quad (8)$$

The gradient vector $$G^k = \{G_x^k, G_y^k, G_z^k\}$$

contains the x, y, and z components of the applied magnetic field gradient during the $k^{th}$ DWI of the six DWIs. Equation (7) and Eq. (8) can be combined with the following results:

$$\ln\left(\frac{A^k(\underline{b})}{A(\underline{b}=\underline{0})}\right) = -\sum_{i=1}^{3}\sum_{j=1}^{3} b_{ij}^k D_{ij} \quad k = 1 \ldots 6. \quad (9)$$

$$b_{ij}^k = \frac{\gamma^2 G_i^k G_j^k \tau^3}{12}. \quad (10)$$

The six noncolinear directions for diffusion-weighted MRI are selected as following: three from a set of optimized orthogonal gradients, the other three which should not satisfy the orthogonality from the other three set of optimized orthogonal gradients. The six elements of the diffusion tensor can be determined from the analytical expressions in Eq. (9) and Eq. (10). That treatment provides a maximum and equal diffusion-weighting factor for general anisotropic tissues, and the six higher SNR diffusion-weighted images permit more accurate determination of the six elements of the diffusion tensor. The sum of the diffusion components in three orthogonal directions is a scalar invariant with rotation. The trace can be calculated directly from a set of optimized orthogonal gradients. Though it is not known in general whether the measurements in orthogonal directions of gradients have any direct relation with the orthogonal eigenvectors of diffusion tensor similarity in general anisotropic tissues, the present method provides a natural way to define a correlation measurement of structural similarity.

If the diffusion weighting factor $b_{ij}$ (i,j=x,y,z or other orthogonal axes frames) in three orthogonal directions are identical for i=j, and $b_{ij}=0$ for i≠j, equation (7) has the following simple form:

$$\ln\left(\frac{A(\underline{b})}{A(\underline{b}=\underline{0})}\right) = -b\frac{Trace(\underline{D})}{3} \quad b \equiv \sum_i b_{ii}. \quad (11)$$

Equation (11) simply states that the logarithm of the normalized signal is proportional to the trace of the diffusion tensor.

For simplicity, the gradient ramps can be neglected because they occupy a very small fraction of the diffusion weighted time τ in routine cases. It is a reasonable choice to apply optimized orthogonal gradients to measure the trace of the diffusion tensor because the peak amplitude of the optimized orthogonal gradients is $1.5G_0$. To minimize the various effects resulting from the imaging gradients and background gradients, the slice-selection gradient compensating for a 90° RF pulse was placed immediately after the 90° pulse. The phase-encoding gradient and the compensation lobe of the readout gradient were placed directly before the signal readout.

Figure 2A:
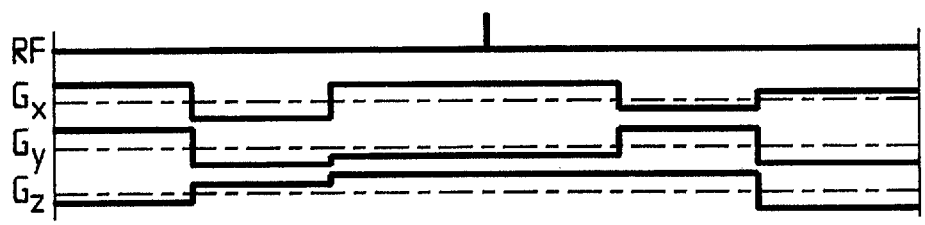
FIGS. 2A and 2B show a gradient pulse sequence in physical space and optimized gradient space, respectively, accordingly to the preferred embodiment.
Figure 2B:
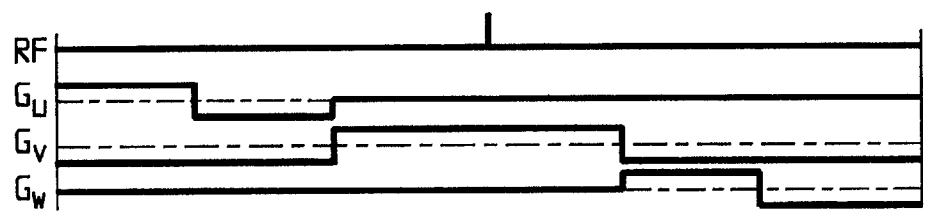

A gradient pulse sequence for measuring the diffusion trace without first order flow moment nulling is shown in FIG. 2A for the physical (x,y,z) coordinate frame and in FIG. 2B for the optimized orthogonal gradient frame, or (u,v,w) frame. In the physical frame, at any given time, as shown in FIG. 2A, one of the gradients $G_x$, $G_y$, $G_z$ has the value ±0.5 $G_0$, while the other two have the value ∓$G_0$. In the optimized frame, at any given time, as shown in FIG. 2B, one of the gradients $G_u$, $G_v$, $G_w$ has the value ±1.5 $G_0$, while the other two have the value zero.

The pulse sequence has the advantage of trivially satisfying the "vanishing off-diagonal" requirement. Its diffusion weighting factor is $b=0.25b_0$ which is larger than those of the prior art which have the efficiency of $b=0.188b_0$.

Compared to the gradient pulse sequence with peak amplitude of $\sqrt{3}G_0$ for single-shot isotropic diffusion-weighted imaging, the sequence just disclosed has four advantages. First, the diffusion weighting factor of the gradient pulse sequence increases 33%. Second, crusher gradients are not necessary because there is a symmetrical diffusion gradient pair around the 180° refocusing pulse. The error caused from crusher gradients is entirely eliminated in the pulse sequence. Third, this gradient pulse sequence has six gradient lobes, which are fewer than the eight used in the prior art. The use of fewer lobes decreases the physiological side effects such as neuromuscular sensations due to fast gradient switching and increases the relative efficiency when gradient ramps are taken into consideration. Fourth, the peak gradient amplitude of 1.5 $G_0$ is clinically safer than that of 1.73 $G_0$. It decreases the acoustic noise mainly resulting from large gradient switching. The resultant power (heat and radiation) of the former is only 0.75 times of the latter. The main features of the two kinds of gradient schemes are listed in Table 3.

TABLE 3

Comparison of the features of the two kinds of gradient schemes

| Gradient amplitude | Weighting factor | Gradient power | Gradient lobes | Crusher pulses |
|---|---|---|---|---|
| $\sqrt{3}G_0$ | $0.188b_0$ | 3 $P_0$ | 8 | Need |
| 1.5 $G_0$ | $0.25b_0$ | $2.25P_0$ | 6 | None |

The last line corresponds to the present invention.

Figure 3:
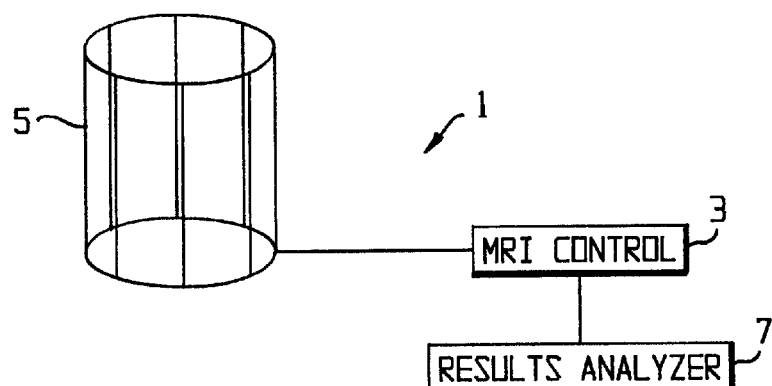
FIG. 3 is a block diagram showing a device on which the preferred embodiment can be implemented.

FIG. 3 is a block diagram showing a device for implementing the techniques described above. The device 1 includes an MRI control device 3 such as a clinical 1.5 Tesla GE SIGNA scanner (GE Medical, Milwaukee, Wis., U.S.A.). The control device 3 controls a coil 5 such as a standard GE quadrature birdcage head coil to produce the field for imaging. The results of the scanning are analyzed in a results analyzer 7, which can be any computing device capable of running an image analyze software such as MATLAB (Math Works, Natick, Mass., U.S.A.). One such computing device is an SGI workstation. Of course, the brand and model choices are illustrative rather than limiting.

Experiments have been performed on a chicken gizzard phantom and a human brain using the device 1 just described. The MRI control device 3 is capable of a peak gradient strength of 23 mT/m and a rise time of approximately 200 $\mu$s. Auto-shim was used in all experiments. Because a two-point method can provide good results in calculating apparent diffusion coefficients of intracranial tissue, all the diffusion coefficients were calculated with two measurements, one without diffusion weighting and another with diffusion weighting. To obtain pure diffusion tensor and trace images, a custom program written in MATLAB was used to calculate and process original data.

The gradient waveform shown in FIG. 2A was chosen to test the validity of optimized orthogonal gradients. For the gizzard phantom, the isotropic diffusion weighted sequence was incorporated into a spin echo imaging sequence. The same imaging sequence with diffusion gradients applied separately along three physical axes was used for comparison. For in vivo human brain imaging, the spin echo sequence was replaced by an echo planar imaging (EPI) sequence to avoid excessive motion artifacts.

The fresh chicken gizzards were cut into approximately 1 cm$^3$ cubes. Those cubes were placed in random orientation in a glass vial 8 cm in diameter; TE/TR=120/1000 ms, FOV=24 cm, 5 mm slice thickness, a 256×128 matrix, ±16 kHz acquisition bandwidth.

Figure 4A:
FIGS. 4A–4E show examples of experimental results of imaging using the invention.
Figure 4B:
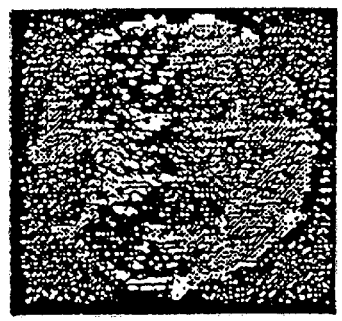
Figure 4C:
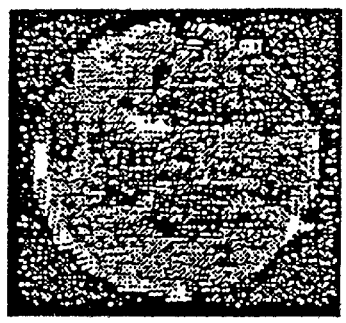
Figure 4D:
Figure 4E:

The experimental results for the chicken gizzard phantom are shown in FIGS. 4A–4E, of which FIGS. 4A–4C show images using regular diffusion-weighted gradient sequences along the x, y, and z directions, respectively; FIG. 4D shows a pure trace diffusion image calculated from FIGS. 4A–4C; and FIG. 4E shows a pure trace image using the gradient waveform of FIG. 2A.

Figure 5:
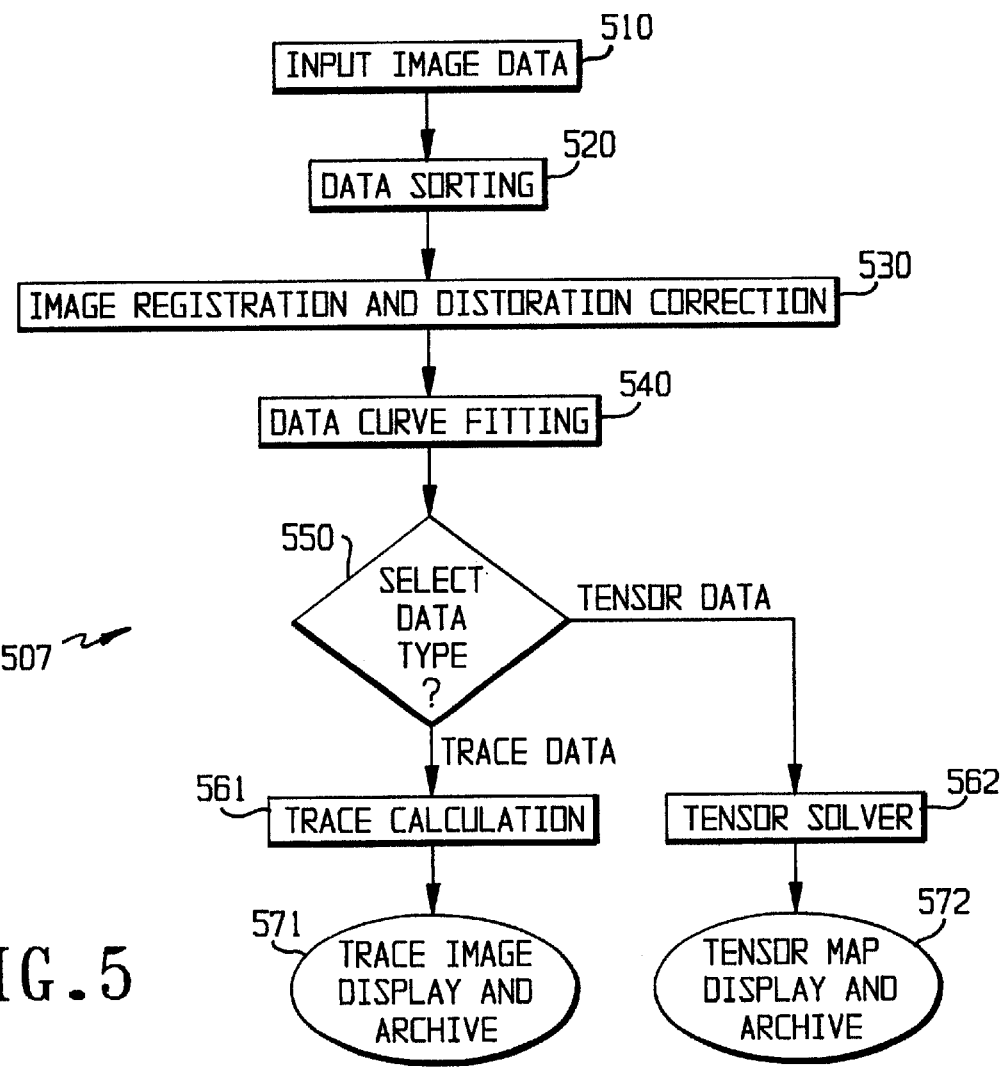
FIG. 5 is a flowchart showing the MATLAB codes for processing data acquired with pulse sequences utilizing the optimized gradients.

FIG. 5 is a flowchart of the MATLAB program referred to above, here labeled as program 507, which preferably runs in the results analyzer 7 of FIG. 3. Program 507 includes diffusion image processing modules. It is preferably coded for use with a graphic user interface. Steps 510–540 are preliminary signal processing steps.

The inputs at step 510 are diffusion-weighted images acquired using the optimized gradients according to the invention. The raw data have already been preferably transformed via an FFT processor (fast Fourier transform program) on a scanner, and the outcome as images is sent into this off-line processor (i.e. analyzer 7) at this stage for further processing.

Depending on the type of the study, those diffusion-weighted images can be a set of three DW images and one non-DW image per each physical slice location for diffusion trace calculation, or a set of six DW images and one non-DW image per each physical slice location for diffusion tensor calculation. In order to increase the signal-to-noise ratio for the calculation of diffusion coefficients (discussed below), more images with varying diffusion weightings may also be acquired.

In step 520, the images are sorted according to their original physical locations and DW magnitude and orientations, using the header information accompanying image files, in addition to the user input on the graphic-user-interface (GUI) of the results analyzer 7.

In step 530, the data (images) of different DW magnitude and orientations at each physical location are aligned and corrected for spatial distortion due to imperfections in the hardware (e.g., effects of eddy current, non-linearity of gradient coils, etc.). Various algorithms can be used. Images of different DW at the same physical location are aligned and corrected for artifacts due to imperfections in the hardware.

Next, at step 540, the data (images) which were sorted in step 520 are fitted, using expressions such as those of in Equation (9) above, on a pixel-by pixel basis. From this fitting, a new set of images can be generated. The intensity of those new images directly represents the magnitude of the diffusion coefficient at each image pixel. The preferred algorithm is a standard non-linear least squares algorithm.

Step 550 depends on the type of study (to calculate trace, or full diffusion tensor). The output in step 540 can be either: three orthogonal components of a diffusion tensor, from which 1the diffusion trace will be calculated in the next step; or, six linear combinations of independent components of a full diffusion tensor, from which a full diffusion tensor will be calculated in the next step. The decision of step 550 leads to different modules for further processing, depending on the type of output from step 540 and the desired choice of study.

The trace is calculated in step 561, simply by taking the average of the three calculated orthogonal components of the diffusion tensor, which resulted from the calculation in step 540.

If the tensor calculation of step 562 is chosen, then step 540 will have provided six linear combinations of independent components of a full diffusion tensor. Independent components of the diffusion tensor will then be calculated by solving six linear equations involving those independent components, as shown for example in Equation (9).

Both trace and tensor outcome will appear on the same display unit. The selection of step 550 determines which should appear.

Because chicken gizzards have strong anisotropic diffusion, each piece of gizzard shows a very different effective diffusion coefficient in FIGS. 4A–4C when the diffusion gradient is applied in only one direction. Those anisotropy effects were almost eliminated either by taking the average of the three images with orthogonal diffusion gradients in FIG. 4D or by employing the isotropic gradient waveform of the preferred embodiment in FIG. 4E. By measuring the tensor trace, the resulting images were uniform and independent of the orientation of the gizzard. The images in FIG. 4E are quite uniform and similar to those in FIG. 4D because the anisotropy effects were almost eliminated. Some heterogeneous regions in the phantom images were due to susceptibility differences in the interfaces and air gaps between chicken gizzards. The results in FIG. 4E show that isotropic diffusion weighting can be achieved in a more efficient manner in a single-shot image sequence as opposed to the three sequences (FIGS. 4A–4C) required to produce the image of FIG. 4D.

For in vivo human brain imaging, the spin echo sequence was replaced by an EPI to reduce motion artifacts. Preliminary scans demonstrate that the isotropic diffusion-weighted images using the single-shot sequence showed a relatively uniform diffusion throughout the white matter, which is in agreement with those calculated from three orthogonal diffusion measurements. The gradient pulse sequence for single-shot diffusion weighting presented in FIG. 2A allows accurate diffusion trace mapping of human brain on a conventional clinical scanner. The gradient pulse sequence is suitable for the study of brain imaging.

Experimental results show that single-shot diffusion-weighted trace images are in excellent agreement with those calculated from three orthogonal diffusion measurements. Therefore, the gradient pulse sequence disclosed herein is valid under such circumstances. In regard to the signal-to-noise ratio, strong gradient strengths in MRI experiments are often desirable as they can reduce echo time. Due to the strong diffusion gradient amplitudes, a concomitant decrease in image artifacts and increase in SNR were achieved in the gradient pulse sequence disclosed herein.

The orthogonal formalism is based on structural features such as diffusion anisotropy, structural similarity, and tissue organization. All cross terms among imaging, background and diffusion gradients are almost eliminated by refocusing imaging gradients just after they are applied. The contributions of the imaging gradients on the signal attenuation can be neglected because the gradient pulse sequence was designed so that all imaging gradients and their remnant cross-terms can be negligibly small. That may improve the accuracy in determining the diffusion tensor. The analytical expressions permit one to evaluate the diagonal and off-diagonal elements of the effective diffusion tensor accurately and efficiently in terms of the intensities of the six diffuision-weighted images. Those formulas simplify the post-processing steps required in diffusion tensor imaging.

Under the guidance of physical intuition and with a simple vector model, the present invention provides a new technique to improve the efficiency for single-shot diffusion-weighted trace MRI and to increase the accuracy in determining the eigenvalues and eigenvectors of the diffusion tensor. An analytical expression of optimized orthogonal gradients is derived from combinations of the three physical orthogonal gradients $G_x$, $G_y$ and $G_z$. With simultaneous application of the three physical orthogonal gradients, the peak amplitude of optimized orthogonal gradients $G_u$, $G_v$, and $G_w$ is 1.5 times that of a single physical gradient. If the three diagonal elements of the diffusion tensor are measured using a single optimized gradient, its diffusion-weighting factor is 2.25 times that of a single physical gradient. That makes it possible to perform diffusion weighting experiments in some clinical scans with lower peak diffusion gradients without modifying hardware.

An effective treatment of the diffusion tensor based on optimized orthogonal gradients is provided. That treatment provides a maximum and equal diffusion-weighting factor for general anisotropic tissues in six noncolinear directions. The gradient pulse sequence is designed with higher symmetry to minimize the background gradient effects and cross-terms between diffusion and/or imaging gradients. The six higher SNR diffusion-weighted images permit more accurate determination of the six elements of the diffusion tensor. The diffusion weighting factor of the gradient waveform proposed herein is 1.33 times that of a recent report applying a gradient pulse sequence with peak amplitude of $\sqrt{3}G_0$ for single-shot isotropic diffusion-weighted imaging.

The diffusion-weighted trace images using the single-shot gradient pulse sequence show a relatively uniform diffusion throughout the white matters. Experimental results demonstrate that those gradient pulse sequences can be used to estimate the diffusion tensor and trace accurately and efficiently on a clinical scanner. That technique is particularly useful for the diffusion tensor measurement and trace mapping of human brains on conventional MR scanners. With higher gradient strengths, the gradient pulse sequence design for single-shot isotropic diffusion weighting MRI may have active potential for clinical application in this regard.

While a preferred embodiment of the present invention has been set forth in detail, those skilled in the art who have reviewed the present disclosure will readily appreciate that other embodiments can be realized within the scope of the invention. For example, while certain hardware has been disclosed, any suitable hardware may be used instead. Also, the gradient pulse sequence may be varied. Therefore, the present invention should be construed as limited only by the appended claims.

We claim:

1. A method of imaging an object using a magnetic field, the method comprising:

(a) providing a magnetic resonance imaging device having a peak physical gradient strength $G_0$;

(b) determining a set of optimized orthogonal gradients of the magnetic field from a combination of three physical gradients, two of the physical orthogonal gradients having values of $G_0$ and a third of the physical orthogonal gradients having a value $-0.5G_0$;

(c) applying a gradient waveform to the magnetic resonance imaging device to cause the magnetic resonance imaging device to form the magnetic field, the magnetic field having the optimized orthogonal gradients determined in step (b); and (d) using the magnetic field formed in step (c) to image the object.

2. The method of claim 1, wherein:

the magnetic field has three orthogonal gradients $G_x$, $G_y$ and $G_z$ in physical space; and the waveform comprises a gradient pulse sequence such that each of $G_x$, $G_y$ and $G_z$ is made equal to $-0.5G_0$ at a separate time.

3. The method of claim 1, wherein step (d) comprises forming an isotropic diffusion image in a single pass of the magnetic resonance imaging device.

4. The method of claim 1, wherein step (d) comprises calculating a diffusion tensor.

5. The method of claim 4, wherein the waveform comprises a gradient pulse sequence having six parts to provide six diffusion-weighted images of the object from which the diffusion tensor is calculated.

6. The method of claim 5, wherein:

the magnetic field has three orthogonal gradients $G_x$, $G_y$ and $G_z$ in physical space; and in each of the six parts of the gradient pulse sequence, one of $G_x$, $G_y$ and $G_z$ is made equal to $\pm 0.5G_0$ while the other two of $G_x$, $G_y$ and $G_z$ are made equal to $\mp G_0$.

7. The method of claim 1, wherein:

the magnetic field has three orthogonal gradients $G_u$, $G_v$ and $G_w$ in an optimized orthogonal space; and the waveform comprises a gradient pulse sequence having a plurality of parts such that, in each part of the gradient pulse sequence, one of $G_u$, $G_v$ and $G_w$ is made equal to $\pm 1.5G_0$ while the other two of $G_u$, $G_v$ and $G_w$ are made equal to zero.

8. A system for imaging an object using a magnetic field, the system comprising:

a magnetic resonance imaging device having a peak physical gradient strength $G_0$;

a controller for (i) determining a set of optimized orthogonal gradients of the magnetic field from three physical gradients, two of the physical orthogonal gradients having values of $G_0$ and a third of the physical orthogonal gradients having a value $-0.5G_0$ and for (ii) applying a gradient waveform to the magnetic resonance imaging device to cause the magnetic resonance imaging device to form the magnetic field, the magnetic field having the optimized orthogonal gradients; and an analyzer for using the magnetic field to image the object.

9. The system of claim 8, wherein:

the magnetic field has three orthogonal gradients $G_x$, $G_y$ and $G_z$ in physical space; and the gradient waveform comprises a gradient pulse sequence such that each of $G_x$, $G_y$ and $G_z$ is made equal to $-0.5G_0$ at a separate time.

10. The system of claim 8, wherein the image is an isotropic diffusion and is formed in a single pass of the magnetic resonance imaging device.

11. The system of claim 8, wherein the analyzer calculates a diffuision tensor.

12. The system of claim 11, wherein the waveform comprises a gradient pulse sequence having six parts to provide six diffuision-weighted images of the object from which the diffuision tensor is calculated.

13. The system of claim 12, wherein:

the magnetic field has three orthogonal gradients $G_x$, $G_y$ and $G_z$ in physical space; and in each of the six parts of the gradient pulse sequence, one of $G_x$, $G_y$ and $G_z$ is made equal to $\pm 0.5G_0$ while the other two of $G_x$, $G_y$ and $G_z$ are made equal to $\mp G_0$.

14. The system of claim 8, wherein:

the magnetic field has three orthogonal gradients $G_u$, $G_v$ and $G_w$ in an optimized orthogonal space; and the gradient waveform comprises a gradient pulse sequence having a plurality of parts such that, in each part of the gradient pulse sequence, one of $G_u$, $G_v$ and $G_w$ is made equal to $\pm 1.5G_0$ while the other two of $G_u$, $G_v$ and $G_w$ are made equal to zero.

* * * * *